(12) United States Patent
Sbiaa et al.

(10) Patent No.: US 7,602,591 B2
(45) Date of Patent: Oct. 13, 2009

(54) EXCHANGE-COUPLED FREE LAYER WITH OUT-OF-PLANE MAGNETIZATION

(75) Inventors: Rachid Sbiaa, Tokyo (JP); Isamu Sato, Tokyo (JP); Haruyuki Morita, Tokyo (JP)

(73) Assignee: TDK Corporation, Tokyo (JP)

( * ) Notice: Subject to any disclaimer, the term of this patent is extended or adjusted under 35 U.S.C. 154(b) by 230 days.

(21) Appl. No.: 11/157,961

(22) Filed: Jun. 22, 2005

(65) Prior Publication Data
US 2006/0291108 A1    Dec. 28, 2006

(51) Int. Cl.
*G11B 5/33* (2006.01)
(52) U.S. Cl. .............................. 360/324.12; 360/324.1
(58) Field of Classification Search ............ 360/324.12, 360/324.1, 324.11
See application file for complete search history.

(56) References Cited

U.S. PATENT DOCUMENTS

| 6,040,961 | A * | 3/2000 | Gill ..................... 360/324.11 |
| 6,104,632 | A * | 8/2000 | Nishimura .................. 365/158 |
| 6,178,073 | B1 * | 1/2001 | Hayashi ................ 360/324.11 |
| 6,219,275 | B1 * | 4/2001 | Nishimura .................. 365/173 |
| 6,275,363 | B1 * | 8/2001 | Gill ........................ 360/324.2 |
| 6,400,536 | B1 * | 6/2002 | Gill ..................... 360/324.12 |
| 6,577,124 | B2 * | 6/2003 | Coehoorn et al. ........... 324/252 |
| 6,650,513 | B2 * | 11/2003 | Fullerton et al. ......... 360/324.2 |
| 6,721,137 | B1 * | 4/2004 | Ikeda ........................ 360/313 |
| 6,967,863 | B2 * | 11/2005 | Huai ........................ 365/158 |
| 6,992,359 | B2 * | 1/2006 | Nguyen et al. ............... 257/421 |
| 2002/0167059 | A1 * | 11/2002 | Nishimura et al. .......... 257/421 |
| 2004/0145850 | A1 * | 7/2004 | Fukumoto et al. ........... 361/143 |
| 2005/0041342 | A1 * | 2/2005 | Huai et al. ............. 360/324.12 |
| 2005/0088789 | A1 * | 4/2005 | Hou et al. .............. 360/324.12 |

FOREIGN PATENT DOCUMENTS

| JP | 2003-229612 A |   | 8/2003 |
| JP | 2003229612 A | * | 8/2003 |

OTHER PUBLICATIONS

O'Cespedes, et al., "I-V asymmetry and magnetoresistance in nickel nanoconstrictions", Journal of Magnetism and Magnetic Materials, pp. 272-276 (2004) 1571-1572.

* cited by examiner

*Primary Examiner*—Andrea L Wellington
*Assistant Examiner*—Carlos E Garcia
(74) *Attorney, Agent, or Firm*—Sughrue Mion, PLLC

(57) ABSTRACT

A magnetoresistive element is provided as a spin valve having a synthetic free layer. More specifically, the synthetic free layer includes a low perpendicular anisotropy layer that is separated from a high perpendicular anisotropy layer by a spacer. Thus, the high anisotropy material introduces an out-of-plane component by exchange coupling. The high perpendicular anisotropy material also has low spin polarization. Further, the low anisotropy material positioned closer to the pinned layer has a high spin polarization. As a result, the magnetization of the low anisotropy material is re-oriented from an in-plane direction to an out-of-plane direction. Accordingly, the overall free layer perpendicular anisotropy can be made small as a result of the low anisotropy material and the high anisotropy material. Adjusting the thickness of these layers, as well as the spacer therebetween, can further lower the anisotropy and thus further increase the sensitivity.

15 Claims, 5 Drawing Sheets

EXCHANGE-COUPLED FREE LAYER WITH OUT-OF-PLANE MAGNETIZATION

BACKGROUND OF THE INVENTION

1. Technical Field

The present invention relates to a magnetic head having an exchange-coupled free layer with out-of-plane magnetization.

2. Related Art

In the related art magnetic recording technology such as hard disk drives, a head is equipped with a reader and a writer that operate independently of one another. The reader includes a free layer, a pinned layer, and a spacer between the pinned layer and the free layer.

In the reader, the direction of magnetization in the pinned layer is fixed. However, the direction of magnetization in the free layer can be changed, for example (but not by way of limitation) depending on the effect of an external magnetic field, such as the recording medium.

When the external magnetic field (flux) is applied to a reader, the magnetization direction of the free layer is altered, or rotated, by an angle. When the flux is positive, the magnetization of the free layer is rotated upward; and when the flux is negative, the magnetization of the free layer is rotated downward. If the applied external magnetic field changes the free layer magnetization direction to be aligned in the same way as pinned layer, then the resistance between the layers is low, and electrons can more easily migrate between those layers However, when the free layer has a magnetization direction opposite to that of the pinned layer, the resistance between the layers is high. This high resistance occurs because it is more difficult for electrons to migrate between the layers.

FIG. 1(a) illustrates a related art tunneling magnetoresistive (TMR) spin valve for the CPP scheme. In the TMR spin valve, the spacer 23 is an insulator, or tunnel barrier layer. Thus, the electrons can cross the insulating spacer 23 from free layer 21 to pinned layer 25 or verse versa. TMR spin valves have an increased magnetoresistance (MR) on the order of about 50%.

FIG. 1(b) illustrates a related art current perpendicular to plane, giant magnetoresistive (CPP-GMR) spin valve. In this case, the spacer 23 acts as a conductor. In the related art CPP-GMR spin valve, there is a need for a large resistance change ΔR, and a moderate element resistance for a high frequency response. A low coercivity is also required so that a small media field can be detected. The pinning field should also have a high strength.

FIG. 1(c) illustrates the related art ballistic magnetoresistance (BMR) spin valve. In the spacer 23, which operates as an insulator, a ferromagnetic region 47 connects the pinned layer 25 to the free layer 21. The area of contact is on the order of a few nanometers. As a result, there is a substantially high MR, due to electrons scattering at the domain wall created within this nanocontact. Other factors include the spin polarization of the ferromagnets, and the structure of the domain that is in nano-contact with the BMR spin valve.

In the foregoing related art spin valves, the spacer 23 of the spin valve is an insulator for TMR, a conductor for GMR, and an insulator having a magnetic nano-sized connector for BMR. While related art TMR spacers are generally made of more insulating metals such as alumina, related art GMR spacers are generally made of more conductive metals, such as copper.

In the related art, it is necessary to avoid high interlayer coupling between the pinned layer and the free layer, so that magnetization of the free layer is only affected by the media magnetic field itself during the read operation. High interlayer coupling has the undesired effect of negatively affecting the output read signal. For example, the signal asymmetry and the hysteresis are substantially increased. This effect is disclosed in Cespedes et al. (Journal of Magnetism and Magnetic Materials, 272-76: 1571-72 Part 2, 2004).

In the current confined path-CPP head, the spacer is made of non-magnetic, conductive areas that are separated from one another by an insulator, such as $Cu-Al_2O_3$. Accordingly, interaction between the free layer and the pinned layer is increased as the thickness of the layers decreases, especially in the cases of GMR and TMR. For example, in the TMR head, the insulating spacer is made very thin to reduce overall device resistance. This reduced TMR spacer thickness also causes the creation of pinholes between the free layer and the pinned layer, which results in an increased interlayer coupling.

In the case of BMR, the interlayer coupling increases as a function of the nanocontacts (which are direct connections) present in the spacer between the free layer and the pinned layer. When the free layer and the pinned layer have opposite directions, a magnetic domain wall can be created. As a result, a high MR ratio can be obtained, with strong electron scattering. For example, when the free layer and the pinned layer are connected by Ni magnetic nanoparticles embedded in an alumina matrix of the spacer, a high interlayer coupling that is greater than about 100 Oersteds (possibly about 200 Oersteds) occurs. As a result, the transfer curve (i.e., voltage as a function of the external magnetic field) becomes asymmetric, and the output signal is substantially reduced.

FIG. 2 illustrates a related art free layer (e.g., 21) from its top view. When a high sense current flows in the direction 51 perpendicular to the plane of the free layer (i.e., into the page of FIG. 2), a magnetic field is generated according to Ampere's law. This magnetic field will create a curling distribution of free layer magnetic moments. (as represented by the arrows 53). Accordingly, there is a need to solve this related art curling problem.

In the related art, this curling problem can be solved by introducing a side stabilizer. However, if the magnetic field generated by the side stabilizer is too high, then the sensitivity of the free layer is reduced. Consequently, free layer rotation will be substantially prevented. Further, the free layer magnetization cannot rotate easily under the media magnetic field. Thus, there is an unmet need to generate a strong magnetic field due to the related art side stabilizer, for example a hard bias stabilizer.

As shown in FIG. 3, in the related art, a single free layer with perpendicular magnetic anisotropy has been proposed. The free layer 21 and the pinned layer 25 are separated by the spacer 23. In this related art scheme, the free layer is made of Fe/Pt, Fe/Pd, or alloys thereof. However, this related art proposal has various problems and disadvantages. For example, but not by way of limitation, this related art proposal has free layer materials that suffer from small spin polarization due to the content of Pt and/or Pd, which is a high anisotropy material.

Thus, there is an unmet need in the related art for a low anisotropy and high spin polarization material that overcome the aforementioned related art problems.

SUMMARY OF THE INVENTION

It is an object of the present invention to overcome the related art problems and disadvantages. However, such an object, or any object, need not be achieved in the present invention.

To achieve the above objects, a magnetic sensor is provided. The magnetic sensor includes a free layer having an adjustable magnetization direction in response to an external magnetic field, the free layer having a first free sublayer having a substantially high perpendicular anisotropy, and a second free sublayer having a substantially low perpendicular anisotropy. The first free sublayer and the second free sublayer are separated by a first spacer. The magnetic sensor also includes a pinned layer having a substantially fixed magnetization direction, wherein the pinned layer is separated from the free layer by a second spacer, and the second sublayer is between the first spacer and the second spacer.

Additionally, a device is provided, comprising a free layer having an adjustable magnetization direction in response to an external magnetic field, the free layer comprising a first free sublayer having a substantially high perpendicular magnetic anisotropy, and a second free sublayer having a substantially low perpendicular anisotropy. The first free sublayer and the free second sublayer are separated by a first spacer. Also included in the device is a pinned layer having a substantially fixed magnetization direction.

DETAILED DESCRIPTION OF THE INVENTION

The present invention is a magnetoresistive element including an exchange-coupled free layer with an out-of-plane magnetization according to the exemplary, non-limiting embodiments described herein, and equivalents thereof as would be known by one of ordinary skill in the art. For example, but not by way of limitation, the magnetoresisitive element may be used in a read head and a memory (e.g., MRAM but not limited thereto), a sensor or other related art device using magnetoresistive effect as would be understood by one of ordinary skill in the art. For example, but not by way of limitation, the sensor may be used as a biosensor for gene and microorganism detection, or the like.

Figure 1A:
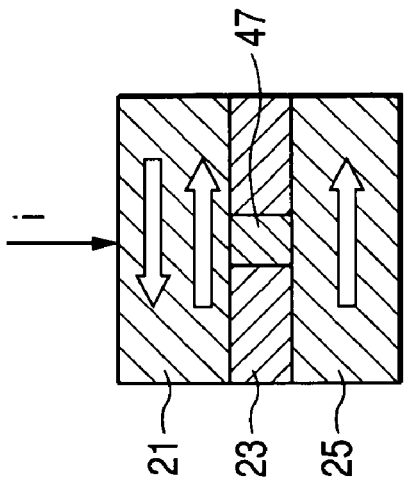
FIGS. 1(a)-(c) illustrates various related art magnetic reader spin valve systems.
Figure 1B:
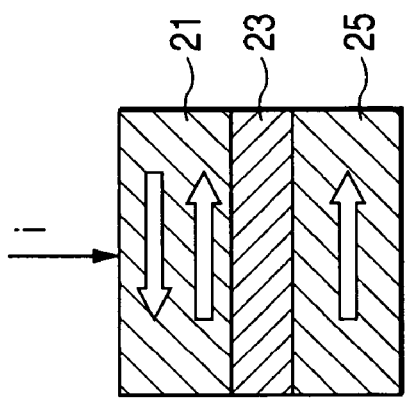
Figure 1C:
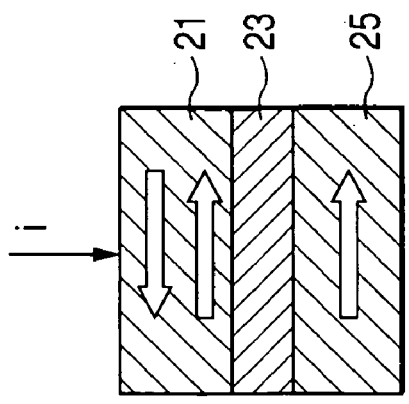
Figure 2:
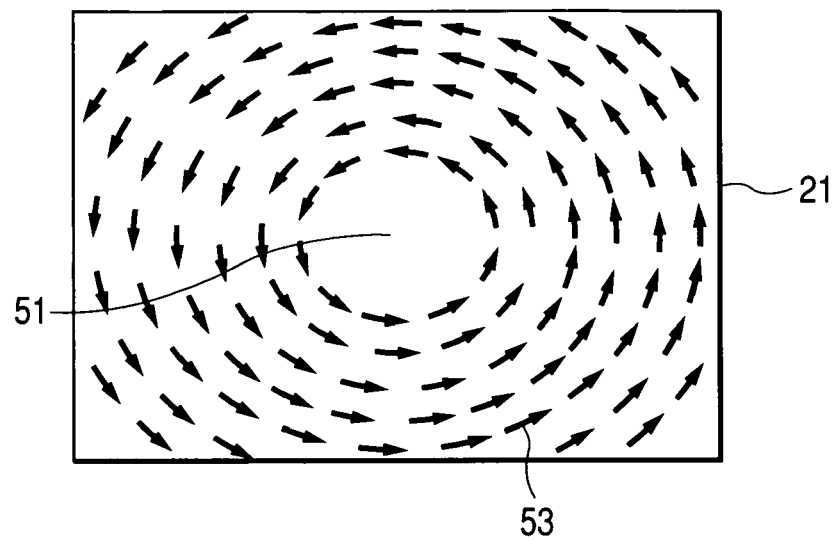
FIG. 2 illustrates a top view of the related art free layer magnetic moment distribution under magnetic field generated by sense current.
Figure 3:
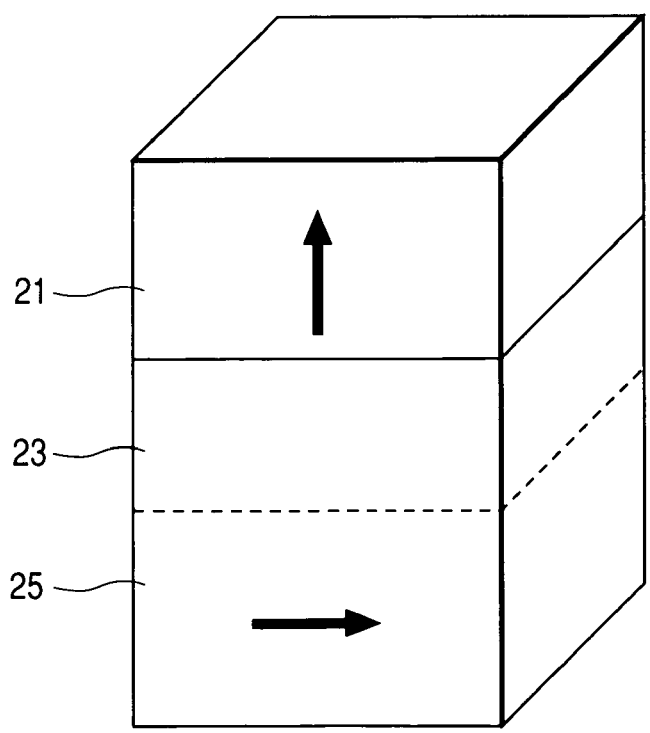
FIG. 3 illustrates a related art proposal to overcome the related art curling problem.
Figure 4:
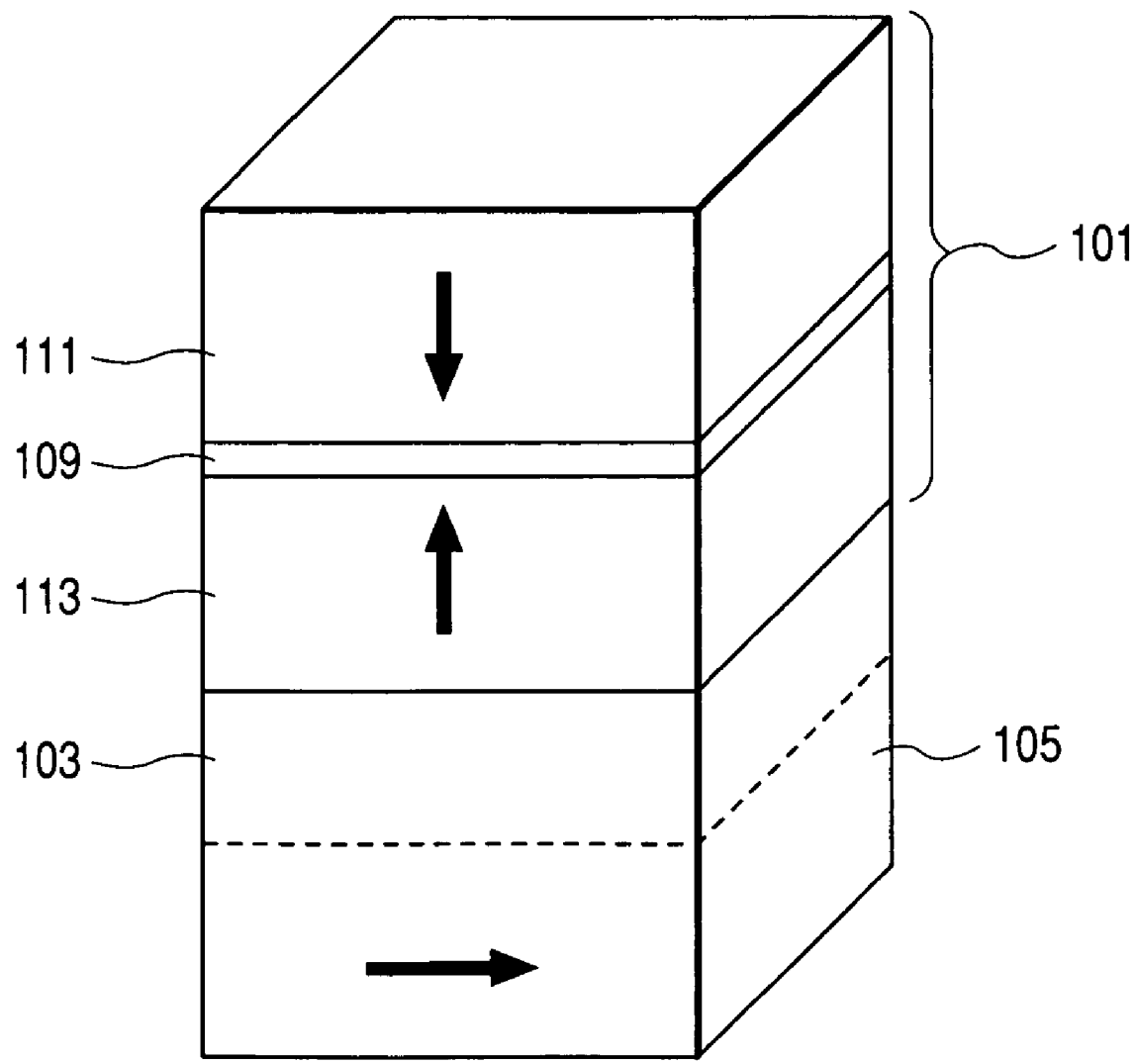
FIG. 4 illustrates a spin valve according to an exemplary, non-limiting embodiment of the present invention.

FIG. 4 illustrates an exemplary, non-limiting embodiment of a spin valve. A synthetic free layer 101 has a magnetization direction that is adjustable in response to an external magnetic field. More specifically, the synthetic free layer 101 includes a first free sublayer 111 having high perpendicular magnetic anisotropy and a low spin polarization, a non-magnetic free sublayer spacer 109 (also referred to as a "first spacer"), and a second free sublayer 113 having low perpendicular magnetic anisotropy and a high polarization.

The perpendicular magnetic anisotropy of the first free sublayer is substantially higher than that of the second free layer. Also, a polarization of the second free sublayer is higher than that of the first free sublayer. Further, the polarization of the first free layer sublayer may not be more than about 0.5 with a high perpendicular magnetic anisotropy of more than about $5 \times 10^5$ erg/cm$^3$.

The exchange-coupling between the first free sublayer 111 and the second free sublayer 113 re-orients the second free sublayer magnetization direction from in-plane to perpendicular-to-plane direction, or about 90 degrees. As a result, the total perpendicular magnetic anisotropy energy of the free layer as a whole can be substantially reduced, as the two layers have low and high anisotropies, respectively.

In another exemplary, non-limiting embodiment of the present invention, the polarization of the first free sublayer 111 and the second free sublayer 113 are substantially the same (e.g., 0.5), while the first free sublayer 111 has a substantially high anisotropy and the second free sublayer 113 has a substantially low anisotropy. However, the present invention is not limited thereto, and other variants as would be known by one of ordinary skill in the art, while not departing from the scope of the invention, can be used.

The free layer 101 is separated from a pinned layer 105 (i.e., having a magnetization direction that is substantially fixed) by a spacer 103 (also referred to as "second spacer").

The first free sublayer 111 is made of (TM/Pt)n, (TM/Pd)n, TM-Pt, TM-Pd or RE-TM alloys, or the like. TM is a transition metal (3d-elements) such as Fe, Co, Ni, Cr or their alloys, and RE refers to rare earth elements (4f-elements) such as Tb, Dy, Gd, and Ho. In this case, (TM/Pt)n is a multilayer lamination of TM layer and Pt layer with n repetitions. TM-Pt is an alloy made of TM and Pt. These layers and alloys can include other elements if these layer or alloys do not lose their perpendicular magnetic anisotropy.

The non-magnetic free sublayer spacer 109 that is within the free layer is made of a material such as Ru, Rh, Ag and Cu. As noted above, this sublayer spacer 109 is non-magnetic, and is positioned between the first free sublayer 111 and the second free sublayer 113. The second free sublayer 113 is made of at least one of CoFe, Fe, Co, CoFeNi, NiFe, CoFeB or the like.

The second spacer 103 is positioned below the second free sublayer 113, and the pinned layer 105 is positioned opposite the free layer interface with the spacer 103. A side of the free layer 101, the spacer 103 and the pinned layer 105, is an air bearing surface (ABS).

The present invention avoids the related art problem of the sensing current effect in terms of creating a vortex-type domain, or the above-discussed magnetization curling problem. For example, but not by way of limitation, first free sublayer 111 of the free layer 101 induces an out-of-plane component in the magnetization direction of the second free sublayer by antiferromagnetic type exchange coupling, without substantially degrading the magnetoresistance.

Figure 5:
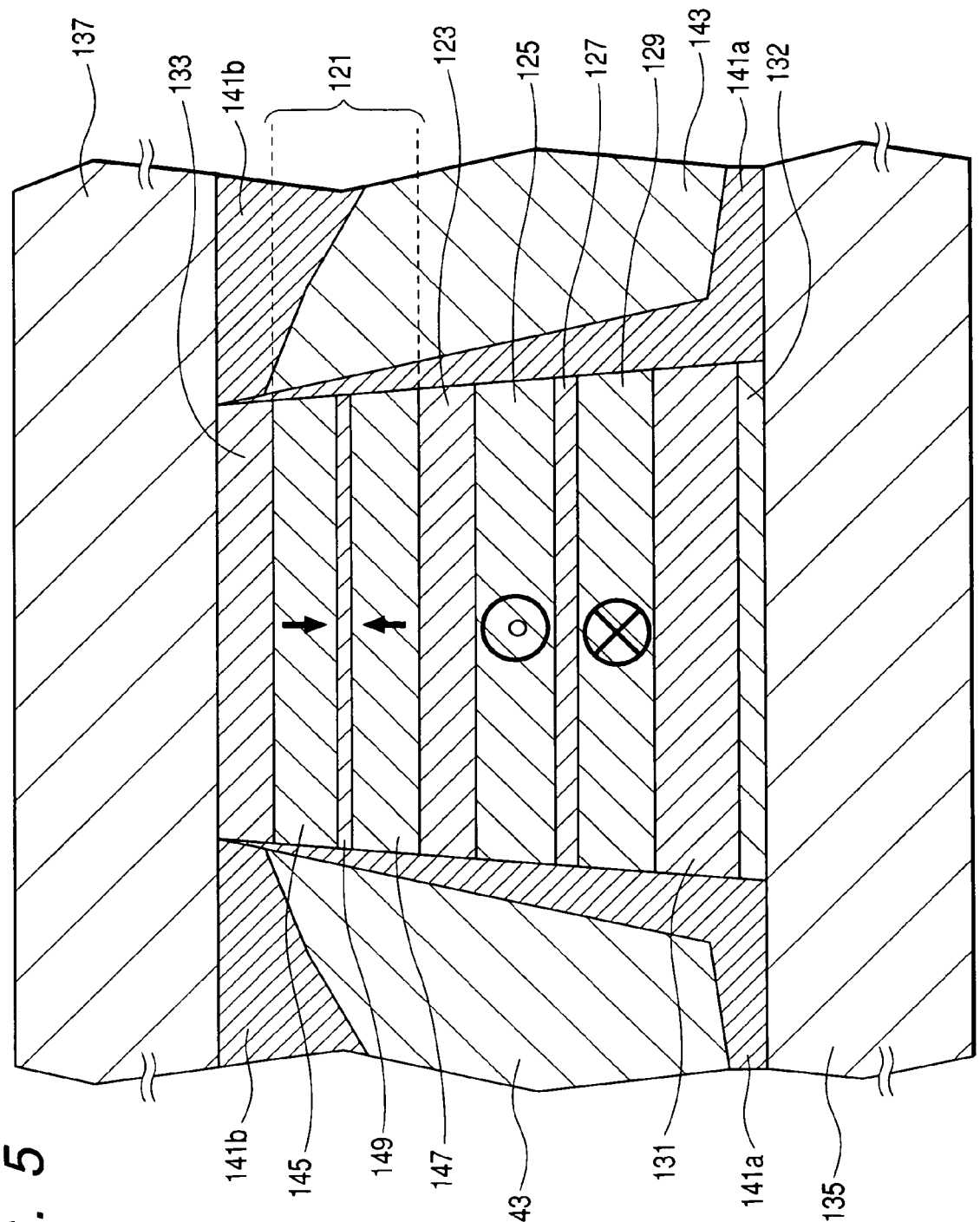
FIG. 5 illustrates a bottom spin valve according to an exemplary, non-limiting embodiment of the present invention.

Further, by adjusting the thickness of the layers of the synthetic free layer, the magnetic anisotropy field of the total free layer can be optimized to a low value (below about 500 Oe) so as to create a high-sensitivity head. FIG. 5 illustrates a bottom-type spin valve according to an exemplary, non-limiting embodiment. In this exemplary, non-limiting embodiment, a free layer 121 is provided, and a second spacer 123 is positioned between the free layer 121 and a pinned layer that includes a first pinned sublayer 125 separated from a second pinned sublayer 129 by a pinned sublayer spacer 127 (also known as the "third spacer"). Additionally, an anti-ferromagnetic (AFM) layer 131 is provided on a buffer layer 132. On the free layer side, a capping layer 133 is provided above the free layer 121.

The buffer layer 132 is positioned on a bottom shield 135. Laterally with respect to the spin valve and an upper surface of the bottom shield 135, an insulator 141a is provided. On the insulator 141a, a side shield 143 is provided to protect the sensor from adjacent track magnetic field. On the side shield 143, an additional insulator 141b is deposited to prevent effectively the sense current from flowing at the side shield. Optionally, the insulator 141a may contact the additional insulator 141b; alternatively, those two layers 141a, 141b may be completely separated by the side shield 143.

This shielding structure is present laterally on the left and right sides of the spin valve. Accordingly, the multi-layer free layer structure of FIG. 4 is provided in the bottom-type spin valve of FIG. 5. More specifically, first free sublayer 145 is separated from a second free sublayer 147 by a free sublayer spacer 149 ("first spacer") within the free layer 121. As a result, the above-described benefits are obtained in a bottom-type spin valve.

The foregoing embodiment may be varied, as would be known by one of ordinary skill in the art. For example, but not by way of limitation, in addition to the above-described bottom-type spin valve, a top type spin valve structure can be used. Further, a hard magnet layer or the like can be used instead of the AFM layer to fix substantially the magnetization direction of the pinned layer. Also, the pinned layer can be made with more than one ferromagnetic layer, as would be known by one of ordinary skill in the art.

Figure 6:
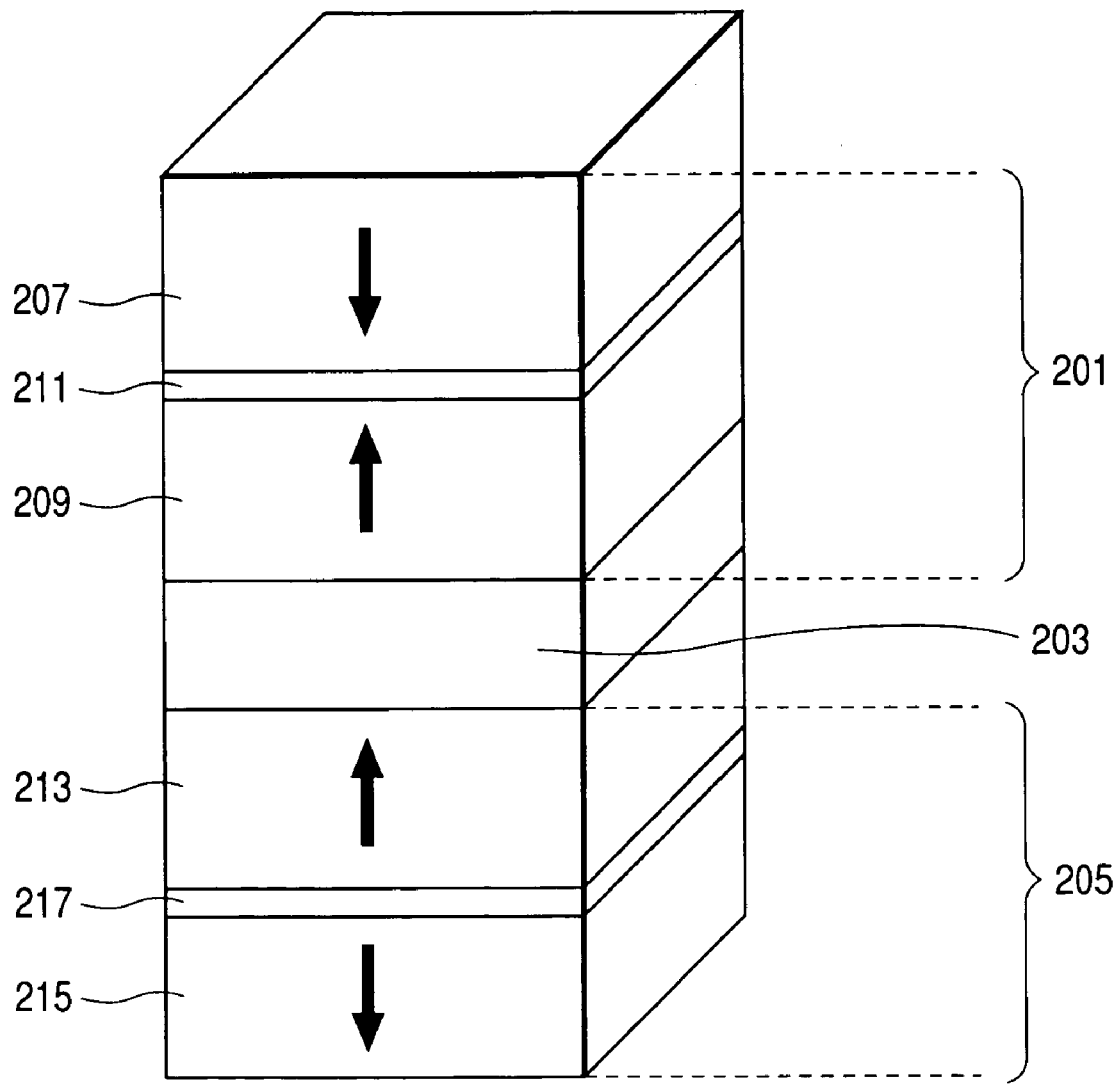
FIG. 6 illustrates an MRAM device according to an exemplary, non-limiting embodiment of the present invention.

FIG. 6 illustrates a memory (for example, but not by way of limitation, MRAM) application. More specifically, the magnetoresistive element of the MRAM is disclosed, including a free layer 201 separated from a pinned layer 205 by a spacer 203 (i.e., "second spacer" in this embodiment). The free layer 201 includes a first free sublayer 207 having low spin polarization and high perpendicular magnetic anisotropy that is separated from a second free layer 209 having a high spin polarization and low perpendicular magnetic anisotropy by a free sublayer spacer 211 ("first spacer" in this embodiment). The pinned layer 205 can be made of two antiferromagnetically coupled magnetic layers separated by a non-magnetic spacer layer. However, the pinned layer 205 can also be made of a single ferromagnetic layer or a lamination of different ferromagnetic layers all having their magnetizations in the substantially same direction.

The pinned layer 205 includes a first pinned sublayer 213 having high spin polarization and low perpendicular magnetic anisotropy that is separated from a second pinned sublayer 215 having low spin polarization and high perpendicular magnetic anisotropy by a pinned sublayer spacer 217 ("third spacer" in this embodiment).

The sublayers 209, 213, are substantially the same as the second pinned sublayer 147 disclosed above and illustrated in FIGS. 5-6, the sublayers 207,215 are substantially the same as the first free layer 145. However, the first pinned sublayer 213 can have either a low anisotropy or a high anisotropy. Accordingly, the structure and/or composition of the layers illustrated in FIG. 6 is substantially the same as that of those illustrated in FIGS. 4-5. For each of the foregoing exemplary, non-limiting embodiments of the present invention, the spin valve may be of a tunnel magnetoresistive (TMR), giant magnetoresistive (GMR), or ballistic magnetoresistive (BMR) type. Further, other types of spin valves that may be known, or become known, to those of ordinary skill in the art may also be employed.

In the present invention, other devices that use the magnetoresistive effect may also comprise the magnetoresistive element of the present invention. For example, but not by way of limitation, a magnetic field sensor or a memory (as disclosed above) may also employ the present invention but the application thereof is not limited thereto. In such an application, or in other applications, the free layer may have an adjustable magnetization in response to an external magnetic field as described above, or to an electrical current. Such applications of the present invention are within the scope of the present invention.

The present invention is not limited to the specific above-described embodiments. It is contemplated that numerous modifications may be made to the present invention without departing from the spirit and scope of the invention as defined in the following claims.

We claim:

1. A magnetoresistive element comprising:
   a free layer having an adjustable magnetization direction in response to an external magnetic field, said free layer comprising
   a first free sublayer having a magnetization direction that rotates in response to an external magnetic field;
   a second free sublayer having a magnetization direction that rotates in response to an external magnetic field, wherein said first free sublayer and said second free sublayer are separated by a first spacer, and said first free sublayer has a higher perpendicular magnetic anisotropy than that of said second free sublayer; and
   a pinned layer having a substantially fixed magnetization direction, wherein said pinned layer is separated from said free layer by a second spacer, and said second free sublayer is between said first spacer and said second spacer,
   wherein a polarization of the first free sublayer is substantially lower than that of the second free sublayer.

2. The magnetoresistive element of claim 1, wherein said first free sublayer comprises at least one of (TM/Pt), (TM/Pd), TM-Pt, TM-Pd and RE-TM, and wherein TM is a transition metal (3d-element) and RE is a rare earth metal (4f-element).

3. The magnetoresistive element of claim 1, wherein said second free sublayer comprises at least one of CoFe, NiFe, CoFeB and CoFeNi.

4. The magnetoresistive element of claim 1, wherein said first spacer comprises at least one of Ru, Rh, Ag and Cu.

5. The magnetoresistive element of claim 1, wherein said second spacer is one of (a) an insulator for a tunnel magnetoresistive (TMR) type spin valve, (b) a conductor for a giant magnetoresistive (GMR) type spin valve and (c) an insulator with at least one conductive nanocontact for a ballistic magnetoresistive (BMR) type spin valve.

6. A device, comprising:
   a free layer having an adjustable magnetization direction in response to an external magnetic field or an electrical current, said free layer comprising
   a first free sublayer having a magnetization direction that rotates in response to an external magnetic field;
   a second free sublayer having a magnetization direction that rotates in response to an external magnetic field, wherein said first free sublayer and said second free sublayer are separated by a first spacer, and said first free sublayer has a higher perpendicular magnetic anisotropy than that of said second free sublayer; and
   a pinned layer having a substantially fixed magnetization direction, wherein said pinned layer is separated from said free layer by a second spacer, and said second free sublayer is between said first spacer and said second spacer, wherein a polarization of the first free sublayer is substantially lower than that of the second free sublayer.

7. The device of claim 6, wherein said device comprises a magnetic field sensor.

8. The device of claim 6, wherein said device comprises a memory.

9. The device of claim 6, wherein said device comprises a read head.

10. The magnetoresistive element of claim 1, wherein the first free sublayer is formed of a first material and the second free sublayer is formed of a second material, and wherein said first material of said first free sublayer is different from said second material of said second free sublayer.

11. The magnetoresistive element of claim 6, wherein the first free sublayer is formed of a first material and the second free sublayer is formed of a second material, and wherein said first material of said first free sublayer is different from said second material of said second free sublayer.

12. The magnetoresistive element of claim 1, wherein a magnetization direction of the second free sublayer is anti-parallel substantially to that of the first free sublayer at zero external field.

13. A magnetoresistive element comprising:
a free layer having an adjustable magnetization direction in response to an external magnetic field, said free layer comprising
a first free sublayer having a magnetization direction that rotates in response to an external magnetic field;
a second free sublayer having a magnetization direction that rotates in response to an external magnetic field, wherein said first free sublayer and said second free sublayer are separated by a first spacer, and said first free sublayer has a higher perpendicular magnetic anisotropy than that of said second free sublayer; and
a pinned layer having a substantially fixed magnetization direction, wherein said pinned layer is separated from said free layer by a second spacer, and said second free sublayer is between said first spacer and said second spacer,
wherein said first spacer comprises at least one of Ru, Rh, Ag and Cu.

14. A magnetoresistive element comprising:
a free layer having an adjustable magnetization direction in response to an external magnetic field, said free layer comprising
a first free sublayer having a magnetization direction that rotates in response to an external magnetic field;
a second free sublayer having a magnetization direction that rotates in response to an external magnetic field, wherein said first free sublayer and said second free sublayer are separated by a first spacer, and said first free sublayer has a higher perpendicular magnetic anisotropy than that of said second free sublayer; and
a pinned layer having a substantially fixed magnetization direction, wherein said pinned layer is separated from said free layer by a second spacer, and said second free sublayer is between said first spacer and said second spacer,
wherein a magnetization direction of the second free sublayer is anti-parallel substantially to that of the first free sublayer at zero external field.

15. A device, comprising:
a free layer having an adjustable magnetization direction in response to an external magnetic field or an electrical current, said free layer comprising
a first free sublayer having a magnetization direction that rotates in response to an external magnetic field;
a second free sublayer having a magnetization direction that rotates in response to an external magnetic field, wherein said first free sublayer and said second free sublayer are separated by a first spacer, and said first free sublayer has a higher perpendicular magnetic anisotropy than that of said second free sublayer, and
a pinned layer having a substantially fixed magnetization direction, wherein said pinned layer is separated from said free layer by a second spacer, and said second free sublayer is between said first spacer and said second spacer,
wherein a magnetization direction of the second free sublayer is anti-parallel substantially to that of the first free sublayer at zero external field.

* * * * *